United States Patent [19]
Salz

[11] Patent Number: 5,740,255
[45] Date of Patent: Apr. 14, 1998

[54] HIGH FIDELITY AUDIO CABLE COMPARATOR AND METHOD THEREFOR

[75] Inventor: David B. Salz, Dania, Fla.

[73] Assignee: Wire World by David Salz, Inc., Ft. Lauderdale, Fla.

[21] Appl. No.: 564,397

[22] Filed: Nov. 29, 1995

[51] Int. Cl.$^6$ .................................................. H04R 29/00
[52] U.S. Cl. ................................ 381/58; 381/124; 324/66
[58] Field of Search ............................. 381/58, 124, 81; 324/66

[56] References Cited

U.S. PATENT DOCUMENTS

| | | | |
|---|---|---|---|
| 4,281,283 | 7/1981 | Ross et al. | 324/115 |
| 4,620,282 | 10/1986 | Shelley | 324/66 |
| 4,670,709 | 6/1987 | Iredale | 324/133 |
| 4,852,174 | 7/1989 | Bouchard | 324/66 |
| 5,285,163 | 2/1994 | Liotta | 324/133 |
| 5,343,534 | 8/1994 | Dorrough et al. | 381/81 |
| 5,477,152 | 12/1995 | Hayhurst | 324/133 |
| 5,566,240 | 10/1996 | Lau | 381/124 |
| 5,627,474 | 5/1997 | Baudisch | 324/66 |

*Primary Examiner*—Curtis Kuntz
*Assistant Examiner*—Xu Mei
*Attorney, Agent, or Firm*—Robert C. Kain, Jr.

[57] ABSTRACT

The method for comparing the sonic characteristics of two pair of audio interconnect cables includes the step of, in a first instance, switching, electrically connecting and transferring the analog electrical signals from an audio source to an amplifier driving a pair of speakers (sometimes speakers in a headphone set) via a pair of reference interconnect cables (sometimes referred to as a reference cable set). In a second instance, the method includes switching, electrically connecting and transferring the analog electrical signals from the audio source to the amplifier and speakers via a test interconnect cables set. The designation of cables as "reference" or "test" cables is not important. The steps of switching, electrically connecting, and transferring the analog signals to and from the reference cables and the test cables are conducted with substantially identical electrical losses and electrical signal distortion. One type of cable comparator may compare a test cable set to a short, direct connect, low loss electrical channel in the comparator. The interconnect cable comparator includes a switch assembly having signal input terminals, switchable cable output terminals, signal output terminals, and switchable cable input terminals. The cable comparator includes high quality RCA female ports or jacks directly coupled to the terminals of the switch assembly. The interconnect cable comparator reduces and eliminates, if possible, electrical losses and electrical signal distortion between electrical channels established through the signal input ports, the switch assembly, the four pair of interconnect cable ports and the signal output ports.

13 Claims, 3 Drawing Sheets

HIGH FIDELITY AUDIO CABLE COMPARATOR AND METHOD THEREFOR

BACKGROUND OF THE INVENTION

The present invention relates to a high fidelity audio interconnect cable comparator and a method for comparing the characteristics of those interconnect cables. Interconnect cables are sometimes referred as patch cords.

Interconnect cables are commonly utilized to connect sources of audio analog electrical signals with the other audio components in an audio recording or playback system, for example, pre- and post-amplifiers, signal processors, mixers, tape recorders, A/D converters, tape players, etc. For example in high fidelity audio systems, compact disc (CD) players are electrically connected to amplifiers and the outputs of those amplifiers are electrically connected to speakers and/or to headphones. In high fidelity systems, the analog electrical signals generated by the musical source or other audio source (e.g., a CD player) are degraded or distorted by the interconnecting cables that link the various components of the audio system together. In order to eliminate or reduce signal distortion and electrical losses normally associated with these interconnect cables, specialized cables have been developed to minimize this audio distortion. However, it is difficult, if not impossible, for the user or purchaser to determine the audible effects, limitations and value of these cables. Distortions in the signals are known to increase as cable length increase.

OBJECTS OF THE INVENTION

It is an object of the present invention to provide a user with a quick method and a simple device to compare the sonic characteristics of two pair of audio interconnect cables.

It is a further object of the present invention to provide a method and a device which enables the user to conduct a high resolution, double blind test of interconnect cables.

It is a further object of the present invention to provide a method and a device which enables the user to compare a single interconnect cable with a reference or low loss signal bypass.

It is a further object of the present invention to provide the user with a simple device wherein the user can readily hear the differences in the performance of one or another interconnect cable sets or by comparing a single interconnect cable set with a hard-wired, low loss electrical channel bypass.

It is a further object of the present invention to provide a comparator which is used in conjunction with unique docking couplers in order to minimize signal degradation through the docking couplers and the comparator.

It is an additional object of the present invention to provide docking couplers that can be rotated such that the couplers can be spaced apart by a user to facilitate direct connection between the comparator and two components in an audio system.

It is an additional object of the present invention to provide an indicator visible to the user which does not clearly indicate which of the two pair of interconnect cables is currently carrying the analog electrical signals.

SUMMARY OF THE INVENTION

The method for comparing the sonic characteristics of two pair of audio interconnect cables includes the step of, in a first instance, switching, electrically connecting and transferring the analog electrical signals from an audio source to an amplifier driving a pair of speakers (sometimes speakers in a headphone set) via a pair of reference interconnect cables (sometimes referred to as a reference cable set). In a second instance, the method includes switching, electrically connecting and transferring the analog electrical signals from the audio source to the amplifier and speakers via a test interconnect cables set. The designation of cables as "reference" or "test" cables is not important. The steps of switching in both instances are controlled by the user such that the user cannot ascertain which pair of cables is electrically connected between the source, the amplifier and the speakers. Also in both instances, the steps of switching, electrically connecting, and transferring the analog signals to and from the reference cables and the test cables are conducted with substantially identical electrical losses and electrical signal distortion.

One type of cable comparator may compare a test cable set to a short, direct connect, low loss electrical channel in the comparator. This low loss electrical channel simulates an "ideal" distortionless cable since distortion is known to increase with cable length.

The interconnect cable comparator includes a switch assembly having many switch terminals. The switch assembly includes signal input terminals, first and second cable output terminals, which are switchably coupled to the signal input terminals, signal output terminals, and first and second switchable cable input terminals which are switchably coupled to the signal output terminals. The cable comparator includes ports (commonly, high quality RCA female jacks or couplers) coupled to the signal input terminals of the switch assembly. The signal input ports are electrically connected to a source of audio analog electrical signals respectively representing left and right audio signals. The cable comparator also includes signal output ports coupled to the signal output terminals of the switch assembly. These signal output ports are electrically connected to the amplifier and pair of speakers (sometimes headphones). The interconnect cable comparator includes four pair of interconnect cable ports which respectively receive the four jacks attached at the terminal ends of the audio interconnect cables. The interconnect cable comparator reduces and eliminates, if possible, electrical losses and electrical signal distortion between electrical channels established through the signal input ports, the switch assembly, the four pair of interconnect cable ports and the signal output ports. Essentially, the electrical losses and the electrical signal distortion through these ports and through the switch assembly are substantially identical such that the signals sent to each pair of audio interconnect cables and received from each pair of audio interconnect cables are not distorted by the cable comparator. With this configuration, the sonic characteristics of the test interconnect cables and the reference interconnect cables are audibly detectable by the user based upon the control position of the switch since the sonic conditions are not substantially affected by the switch, the signal input ports, the four pair of cable ports and the signal output ports.

BRIEF DESCRIPTION OF THE DRAWINGS

Further objects and advantages of the present invention can be found in the detailed description of the preferred embodiment when taken in conjunction with the accompanying drawings in which.

DETAILED DESCRIPTION OF THE PREFERRED EMBODIMENT

Figure 1:
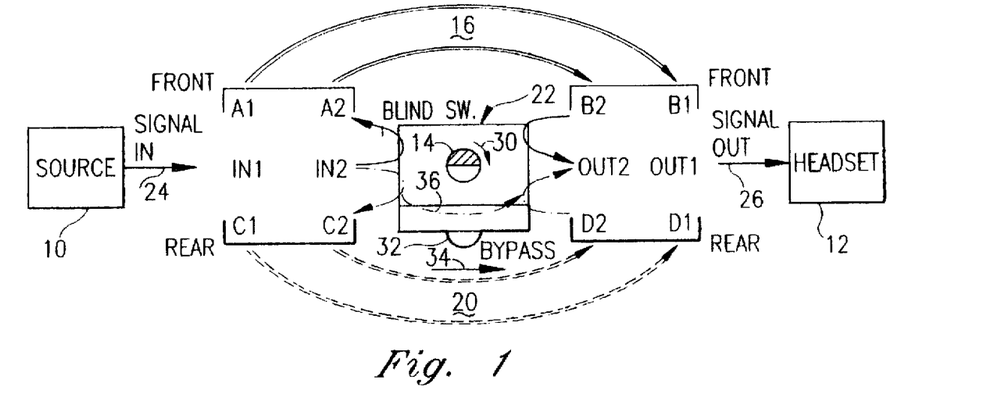
FIG. 1 illustrates a block diagram of the interconnect cable comparator and the method for comparing the sonic characteristics of the audio interconnect cables.

The present invention relates to a method and a system for comparing the sonic characteristics of two pair of audio interconnect cables. FIG. 1 is a block diagram illustrating the switch assembly and the interconnect cables as well as the source of analog electrical signals and the speakers for the detecting the sonic characteristics of interconnect cables. In high fidelity audio applications, the user normally has a musical source or audio source 10 which generates audio analog electrical signals. The term "musical source" or an "audio source" as used herein includes an audio component with a line level output. These analog electrical signals are produced by source 10 as left and right audio signals. Source 10 may be a CD player, a turn table, a radio frequency tuner or any amplifier, mixer, electric guitar keyboard or other audio component with a line level output. Preferably, source 10 is a CD player. CD players are known to be the most commonly available source of high quality of analog electrical signals. The analog electrical signals output by source 10 may be fed to a receiver, integrated amp, pre-amp, etc. (not shown). Although these amplifiers are not shown herein, the interconnection between source 10, a pre-amplifier, a user controllable variable amplifier, and headset 12 or other speakers is customarily accomplished through audio interconnect cables. These interconnect cables normally plug into source 10, and carry the signals to various amplifiers via single, conventional RCA plugs or jacks. Female versions of these RCA plugs are shown as signal ports as 64, 66, 70, 72, 74, and 76 in FIG. 3. These signal ports are discussed below in conjunction with FIG. 3.

Users of high fidelity audio equipment usually want to improve the quality of sound emitted by headset 12 or other types of acoustic speakers coupled to the sound system. To improve the sound, the user can purchase a higher quality audio components. Additionally, the user may want to purchase high quality, low electrical loss and low signal distortion interconnect cables. In the past, users could not easily compare the quality of sound delivered by different audio interconnect cables.

It is well known that all cables and electrical signal conduits affect the electrical signals passing through those devices. Signal degradation is caused by electrical losses and discontinuities in the cables and electrical signal distortion is introduced by the cables into the audio electrical signals. The present invention provides a device and a method whereby the user can plug in two different pair of audio interconnect cables, rotate switch 14 (FIG. 1) and thereby select one or the other of the audio interconnect cables.

Figure 11:
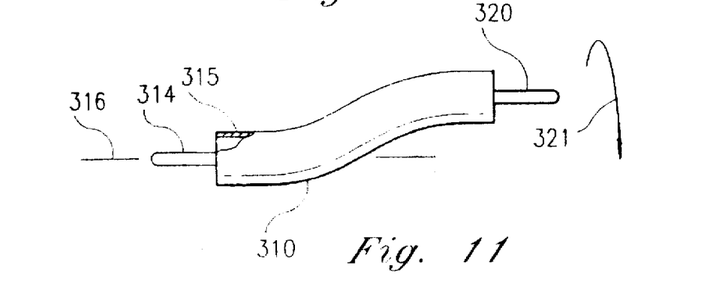
FIG. 11 diagrammatically illustrates one of the docking couplers.

In FIG. 1, audio interconnect cables 16 are shown as solid double lines. Audio interconnect cables 20 are shown as double dashed lines. Since the internal components of switch assembly 22 are not visible to the user, switch assembly 22 operates as a blind switch. In a preferred embodiment, the user plugs in interconnect cable set 16 into switchable cable output ports A1 and A2 and switchable cable input ports B1 and B2. For example, ports A1 and B1 may carry the left audio signals and ports A2 and B2 may carry the right audio signals. The user also plugs in cable set 20 into switchable cable output ports C1, C2. The other end of cable set 20 is plugged into the female portion of the RCA jacks forming switchable cable input ports D1, D2. As is common in the industry, these cables terminate in male RCA jacks or couplers. The source of analog electrical signals representing music or other frequency or tones is electrically coupled to signal input ports IN1 and IN2. These analog signals are applied on line 24. As discussed below in conjunction with FIG. 11, line 24 is preferably a docking coupler. Also, line 24 represents two electrical conduits such that one docking coupler (shown in FIG. 11) is connected to IN1 and a second docking coupler is connected between source 10 and signal input port IN2.

On the output side, output signal ports OUT1 and OUT2 are electrically connected via a second set of docking couplers to the next component in the audio system and ultimately to a headset 12 or a set of speakers. As is know, headset 12 is a pair of speakers that are mounted on a cradle adapted to be placed on a user's head. Alternatively, a pair of acoustic speakers could be used such that the user can listen to the quality of sound and the sonic characteristics of the converted analog electrical signals. These converted analog electrical signals are audible sounds heard and detected by the user in order to determine the sonic characteristics of cable pair 16 as compared with cable pair 20.

The user is primarily interested in selecting the best cable set from interconnect cables 16 and pair 20. In order to conduct a test of the sonic characteristics of these two pair of audio interconnect cables, the user may select a very highly regarded and/or very short length of cable to serve as a reference cable 16. The user may then compare that the quality of the sound carried by reference cable 16 as compared with the quality of the sound generated by the audio source and carried by test cable set 20. Of course, it does not matter which set of interconnect cables is designated as the "reference cable set" or the "test cable set."

As used herein, the designations of "reference cables" and "test cables" are not important or critical because the user decides which cable set performs better than the other cable set based upon the comparator switch position and the audible response from each cable set. Ultimately, the user selects the "best" cable set and learns the audible effects of the cables by listening to the music while switching between the coupled cables without regard to the "reference" or "test" designator.

After audio interconnect cable pairs 16 and 20 are plugged into switchable cable ports A1, A2, B1, B2, C1, C2 and D1, D2, the user then rotates knob 14 such that it is not clear which switch position relates to the transfer of analog electrical signals through a particular interconnect cable pair 16 or 20. As discussed later in connection with FIG. 3, the switch assembly is a ganged, two switch system such that both switches are either in the first position, transferring electrical systems through cable pair 16, or in a second position transferring electrical signals through cable pair 20. When the user rotates knob 14, a cam mechanism shown in connection with FIGS. 6A–6D and FIGS. 7–9 moves the ganged switches between the first position and the second position.

In the first position, input electrical signals are applied through input signal ports IN1 and IN2 and are passed through blind switch 22 to cable output ports A1 and A2. These signals then pass through cable pair 16 and are fed back into the switch comparator via cable input ports B1, B2. The signal then is transferred through blind switch 22 and passed to signal output ports OUT1 and OUT2. These analog electrical signals pass through the docking couplers to the next component in the audio system and are ultimately applied to the loudspeakers or the speakers in headset 12 and the user can detect the sonic characteristics of those signals and hence "hear" the electrical losses and signal distortion injected into those signals by cable pair 16.

By rotating switch 14 in the direction shown by arrow 30, the user can change the electrical path from interconnect cable pair 16 to interconnect pair 20. Signals pass from source 10, through electrical coupler 24 (preferably docking couplers) and into signal input ports IN1 and IN2. The signals then pass through blind switch 22 and out to cable input ports C1 and C2. The signals then pass through interconnect cable pair 20 and are applied at cable input ports D1 and D2. The signals are then fed back or through input into blind switch assembly 22. The cable "inputs" signals into the comparator. From the switch the signals are sent to signal output ports OUT1 and OUT2. Output line 26 then feeds these signals to the speakers in headset 12. In this manner, the user can switch between interconnect cable pair 16 and interconnect cable pair 20 and readily detect the sonic characteristics of the signal and hence the electrical losses and electrical signal distortion caused by cable pair 16 as compared with cable pair 20.

It is believed that the cable comparator described in this invention is the first cable comparator which can accurately compare the sonic characteristics, electrical signal losses and electrical signal distortion in two audio interconnect cables 16, 20.

If the user wants to compare only audio interconnect cable 16 to a reference bypass, the user can uncouple cable pair 20 and move bypass switch 32 from left to right as shown by arrow 34. After interconnect cable pair 20 is uncoupled, and bypass switch 32 is closed (resulting in a closure of signal path 36), the user can rotate knob 14 thereby comparing audio cable 16 to a direct or a hard wire connection between source 10 and headset 12. As discussed later, the present cable comparator shown in FIG. 1 has substantially identical electrical losses between the following electrical signal channels: IN1, C1, D1, OUT1; IN2, C2, D2, OUT2; IN1, A1, D1, OUT 1; and, IN2, A2, B2 and OUT 2. Substantially identical electrical loss and electrical signal distortion is achieved in these electrical signal channels by placing the electrical ports, or jacks and the switch terminals in close physical proximity such that the terminals are directly and mechanically in contact with the signal port terminals.

Alternatively, the interconnect cable may be compared solely against the low electrical loss channels established by the bypass switch. In this single cable set system, the bypass switch may be eliminated and the switchable terminals C1, C2 and D1, D2 may be hard wired together.

Figure 2:
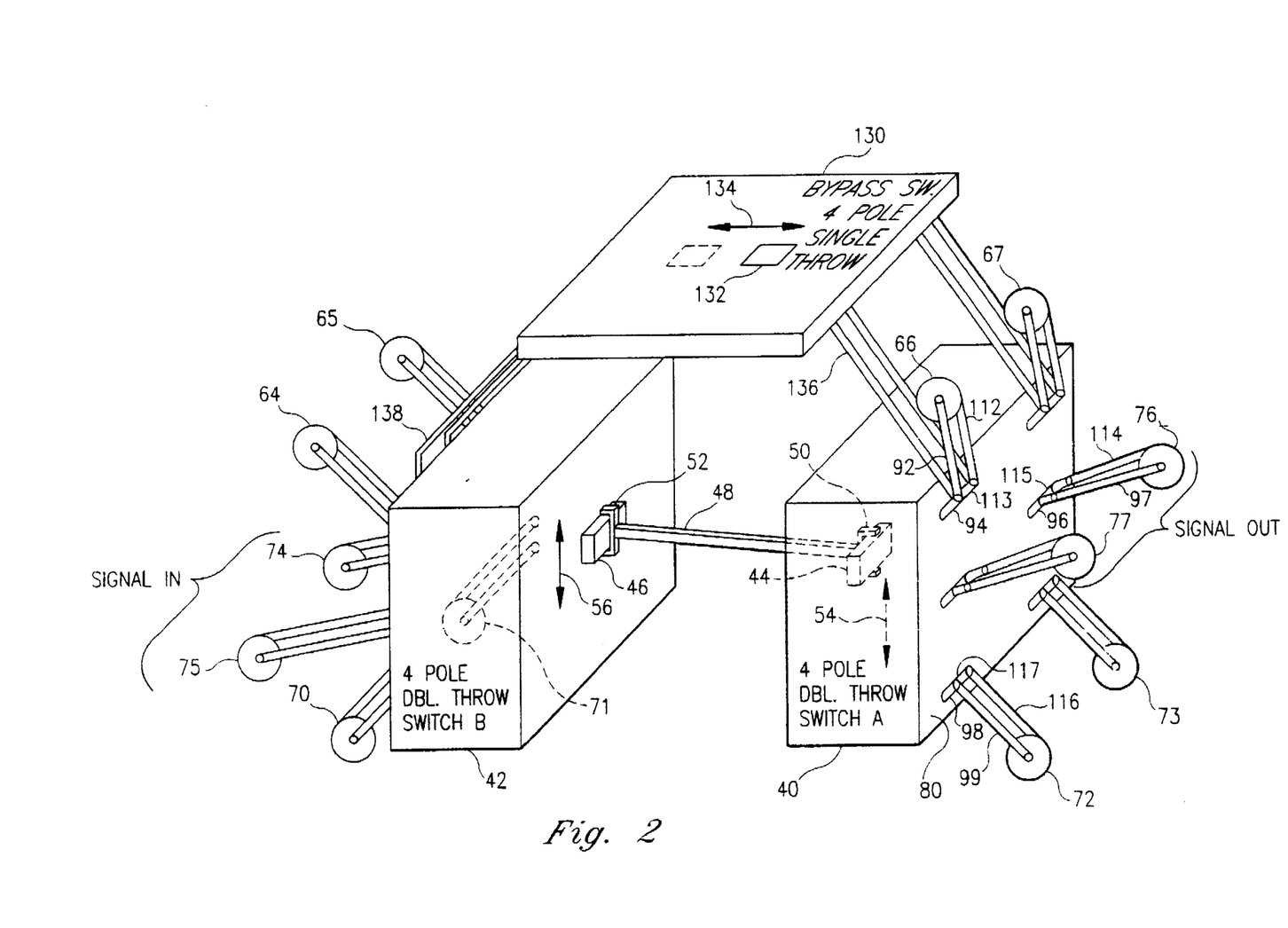
FIG. 2 diagrammatically illustrates the cable comparator.
Figure 3:
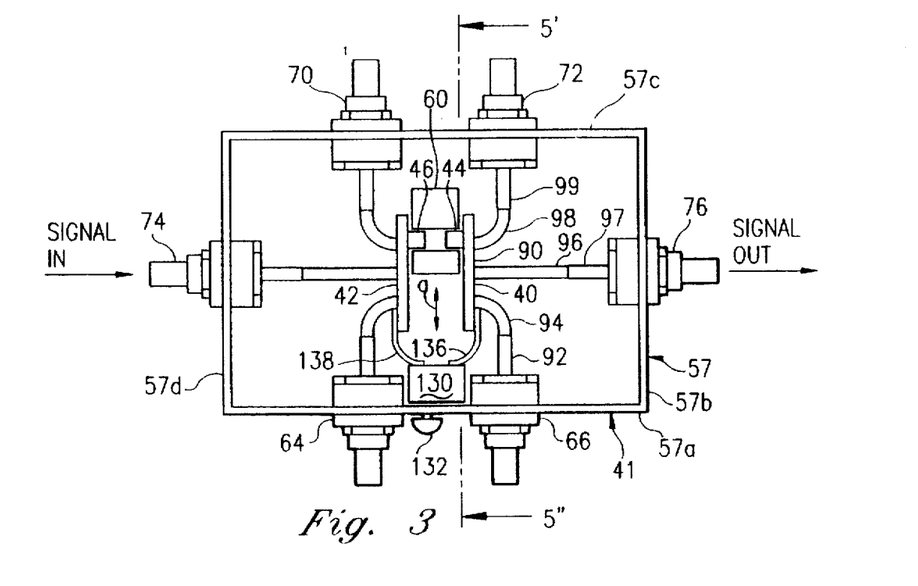
FIG. 3 is a top, plan view of the cable comparator in accordance with the principles of the present invention.

FIGS. 2 and 3 will be discussed substantially simultaneously herein and similar numerals designate similar items in those figures. In FIG. 2, the switch assembly includes a four pole, double throw switch A 40 and a four pole, double throw switch B 42. These switches have a slidable controls 44 and 46. These slidable controls are ganged together. The ganging of switch controls 44, 46 is diagrammatically illustrated in FIG. 2 by bar 48 and mating sleeves 50 and 52. Switch slide controls 44, 46 move in the direction shown by arrows 54 and 56. These switch controls are ganged together such that when the user rotates the user control (shown as knob 14 in FIG. 1), the position of switches 40, 42 change substantially simultaneously. Other actuation devices, other than the rotating knob and cam described hereinafter may be used.

Figure 5:
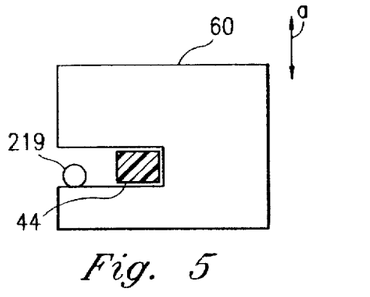
FIG. 5 diagrammatically illustrates one structure which provides the ganging for the switch actuators.
Figure 7:
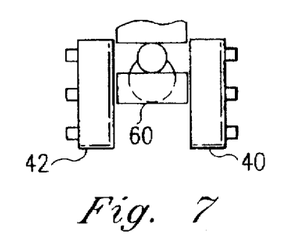
FIGS. 7, 8 and 9 diagrammatically illustrate the first position (FIG. 3), an intermediate position and the second position (FIG. 4) of the ganging block for the switch assembly (these figures correspond, in general, to the cam positions in FIGS. 6A, 6C and 6D, respectively)
Figure 8:
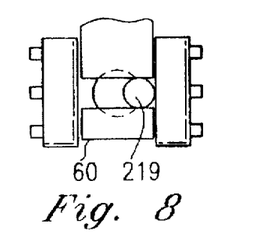
Figure 9:
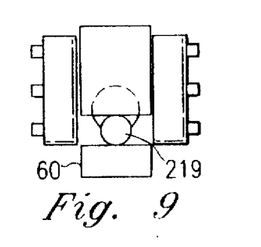

Referring now to FIG. 3, the cable comparator 41 includes a generally rectangular box 57 with front, right, rear and left sides 57A, 57B, 57C and 57D. Switches 40, 42 are disposed in the interior of the box. FIG. 3 is a top, plan view of cable comparator 41. Slide controls 44 and 46 are ganged together via ganging block 60. FIG. 5 diagrammatically shows block 60 from the perspective of section line 5'-5" in FIG. 3. The slide switch control 44 is shown in cross section in FIG. 5. Offset cam 219 moves ganging block 60 as shown in FIGS. 7–9.

The female portion of the RCA jacks are distributed about the periphery of container box 57. Front side 57A retains four RCA female jacks or ports only two of which are shown as ports 64 and 66 in FIG. 3. The other ports or jacks are disposed immediately below ports 64, 66. Returning to FIG. 2, the front side, left top RCA female jack 64 is diagrammatically illustrated as well as the front side, lower left RCA female jack 65. The front side, right upper RCA female jack 66 is shown in FIGS. 2 and 3 and the front side, lower right RCA female jack 67 is diagrammatically shown in FIG. 2.

FIG. 3 also illustrates rear side, upper left RCA female jack 70 and rear side, upper right RCA female jack 72. Returning to FIG. 2, the rear side, left RCA female jacks are shown as 70, 71. The rear side, right RCA jacks are shown as jacks or signal ports 72, 73 in FIG. 2.

Analog electrical signals are fed into cable comparator via RCA female jacks comprising signal input ports 74, 75 shown in FIG. 2. Only the upper port 74 is illustrated in FIG. 3 protruding from the left side 57D of the cable comparator. On the right side 57B of the cable comparator, two female RCA couplers 76, 77 output the output analog signals. Coupler 76 is shown in FIG. 3.

An important feature of the present invention is the direct mechanical and physical connection of the switch terminals to the backside of these RCA couplers. This structural aspect of the present invention is best shown in FIG. 3. For example with respect to switch 40, that switch has 12 terminals extending from backside 90. These terminals are bent or moved such that they physically, directly and mechanically connect with the appropriate terminal on the appropriate RCA signal port. For example with respect to RCA signal port or coupler 66, that coupler has a central backside coupler terminal 92. Switch 40 has a switch terminal 94 that is bent such that the switch terminal itself contacts the coupler terminal 92. Thereafter, the joint is electrically connected and fixed with solder. Switch terminals 96 and 98 are mechanically and physically moved such that they contact and are soldered to RCA coupler terminals 97 and 99. Switch 40 has 12 switch terminals extending from rear or bottom side 90. Each one of these terminals are bent and are mechanically, physically and directly connected to the appropriate coupler terminals.

Returning to FIG. 2, switch terminals 94, 96 and 98 are diagrammatically shown as being directly and physically connected to coupler terminals 92, 97 and 99. These coupler terminals are associated with RCA signal jacks 66, 76 and 72. As diagrammatically illustrated in FIG. 2, those jacks also have ground terminals 112, 114 and 116 corresponding to signal ports or RCA couplers 66, 76 and 72, respectively. Those ground terminals are directly and physically connected as well as being soldered for mechanical stability and electrical conductivity to switch terminals 113, 115 and 117, respectively.

This direct, physical, mechanical and electrical connection between the switch terminals and the coupler terminals is utilized for all the signal ports. Accordingly, the signals passing through electrical channels established by signal ports 74, 75, 64, 65, 70, 71, 66, 67, 76, 77 and 72, 73 are not degraded and these pathways are substantially identical with respect to electrical losses and electrical signal distortion through each pathway or channel. High quality, four pole, double throw switches are utilized such that the internal electrical channels established by these switches are substantially identical with respect to electrical losses and electrical signal distortion. An example of high quality, four pole, double throw switch is a SwitchCraft switch, Model No. 50212, slide switch. Also, high quality, RCA female jacks are utilized. The jacks are high quality, gold plated, TEFLON insulated RCA jacks.

In the event the user does not want to compare two audio interconnect cables, the user may disconnect one of the audio interconnect cables. This is discussed above in connection with FIG. 1 and cable set 20. Under those conditions, the user may want to bypass that cable channel. This is accomplished by bypass switch 130. Bypass switch 130 is, in the preferred embodiment, a four pole, single throw switch having a slide control 132. This slide control moves left to right as shown by arrow 134. The OFF or OPEN position for bypass switch 130 is shown in dashed lines in FIG. 2.

Bypass switch 130 has 8 switch terminals. A short, insulated wire is attached to each one of these 8 switch terminals. This insulated wire is identified as wire 136 in FIG. 2. Wire 136 is electrically connected between bypass switch 130 and switch terminal 94 of switch 40. This direct connect wire 136 is also shown in FIG. 3. In order to transfer the signals from the input side, (couplers 75, 75) to the output (couplers 76, 77), the other side of bypass switch 130 is connected via wire 138 to the appropriate switch terminal for switch 42. This switch terminal is the terminal mechanically, directly and physically connected to RCA port 64. Bypass switch 130 is physically positioned on front side 57A of comparator box 57. The bypass switch is positioned at intermediate front side cable ports 64, 65 and 66, 67. In this manner, the user can easily disconnect the front side interconnect cable set and change the position of bypass switch 130 by sliding user control 132 to one side or the other. In this matter, the user, while listening to the music in headset 12 or other loudspeaker system, can ascertain the quality of interconnect cables attached to cable ports 70, 71, 72, 73 attached to the rear side of the signal comparator. This is a test with respect to a low loss electrical channel through the bypass switch. It is not recommended that the bypass switch be closed at the same time a cable set connects front side cable ports 74, 75, 76, 77.

Figure 4:
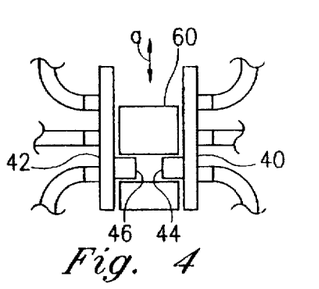
FIG. 4 is a partial, top plan view of the ganged switch in a second position (FIG. 3 shows the ganged switch in a first position)

FIG. 3 illustrates the ganged switches 40, 42 in a first position. For example, in this first position, electrical channels are established by signal ports 74, 70, and the interposed switch 42, the audio interconnect cable (not shown), extending between ports 70, 72, switch 40 and signal output port 77. The second position of the switch is shown in FIG. 4. In this figure, ganging block 60 has been moved such that slide controls 46 and 44, respectively for switches 42 and 40, are in the second position. In the second position, an electrical channel is established between input port 74, cable output port 64 (the signal is "output" to the cable), cable input port 66, and signal output port 76.

It should be noted that the physical dimensions shown in FIG. 3 for the components and between the components is not accurate and that figure only approximates the dimensional sizes of the various switch terminals and signal port terminals.

Ganging block 60 is moved in the direction shown by arrows a in FIGS. 3, 4 and 5 based upon a rotating cam.

Figure 6A:
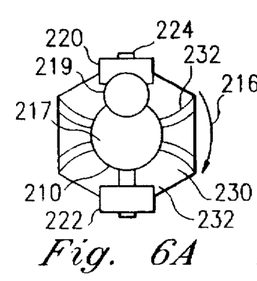
FIGS. 6A, 6B, 6C and 6D diagrammatically illustrate the offset cam mechanism to actuate the ganged switch assembly.
Figure 6B:
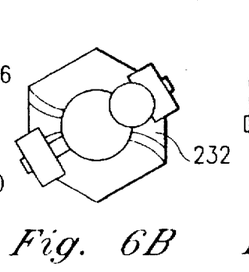
Figure 6C:
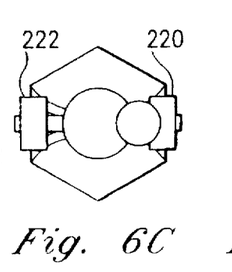
Figure 6D:
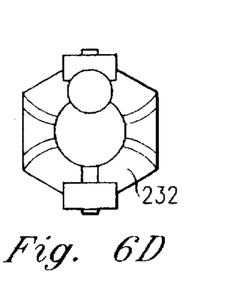

This rotating cam is shown in FIGS. 6A, 6B, 6C and 6D. The switch position shown in FIG. 7 corresponds to rotating cam position in FIG. 6A. Cam position in FIG. 6C is shown as switch position in FIG. 8. Cam position in FIG. 6D is shown as switch position in FIG. 9. As the cam rotates, ganging block 60 moves and further moves slide controls 44, 46.

Figure 10:
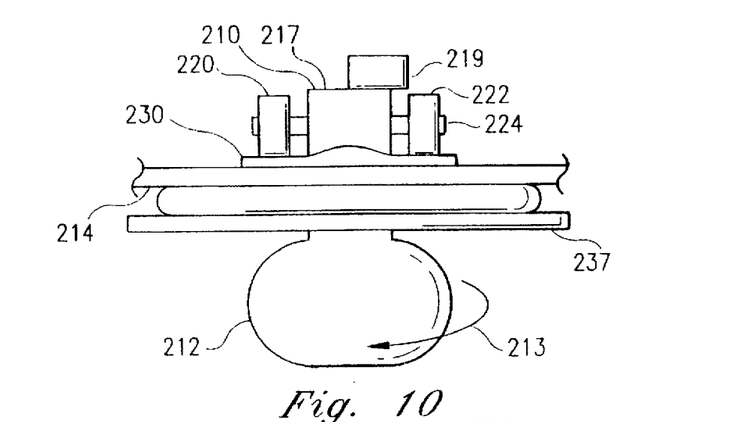
FIG. 10 illustrates a partial view of the operator control knob which enables the operator to rotate the offset cam and place the switch assembly in the first position or the second position.

The rotating cam includes a cylindrical rotating element 210. Referring to FIG. 10, this rotating cylindrical element 210 is affixed to knob 212. Knob 212 protrudes through the top side 214 of the switch comparator. A rubber washer or gasket is in the interposed between disk 237 and top side 214. Accordingly, when knob 212 is rotated in the direction shown by arrow 213, cylindrical element 210 rotates in the direction shown by arrow 216 in FIG. 6A.

Affixed to bottom surface 217 of cylindrical element 210 is an offset cylindrical element 219. This offset cylindrical element 219 is best shown in FIG. 10. Accordingly, when knob element 210 is rotated in direction 216 (FIG. 6A), offset cylindrical element 219 rotates in an offset manner therewith. In order to facilitate this rotation, the entire knob assembly is mounted on nylon wheels 220, 222. These wheels are connected together by a shaft 224. The wheels are mounted on the shaft by appropriate spring clips passing through a grove cut in the outboard terminal ends of shaft 214.

In order to ensure that the rotating cam positions the slide controls 44, 46 in either the first or the second position, nylon wheels ride 220, 222 on a specially configured or shaped nut surface 230 (FIG. 10). This nut surface 230 has a pair of opposing concave regions, one of which is region 232, and a pair of high or raised regions 232. Accordingly, when the rotating knob assembly is in the position shown in FIG. 6A, the offset cam operates to place block 60 in the first switch position such that switches 40, 42 establish an electrical connection between the cables attached to the rear side of the cable comparator. This cable connection includes a signal flow through port 74, switch 42, port 70, the interconnected audio cable, signal port 72, switch 40 and signal port 76. When rotating knob 212 is rotated in direction 213 shown in FIG. 10, the offset cam moves in direction 216 shown in FIG. 6A. This causes the wheels to ride up on ridge or high region 232 and the user feels the tension as he or she turns knob 212. See FIG. 6B. This tension further increases when wheels 220 and 222 are squarely on top of ridge 232 as shown in FIG. 6C. In the corresponding switch position, (FIG. 8) ganging block 60 is positioned by offset cam 219 in an intermediate switch position. In FIG. 6D, the wheels are guided into low areas 232 and the user can feel the release of tension since the wheels can easily move in low region 232. As shown in FIGS. 6D and 9, the offset cam 219 has moved ganging block 60 to the second switch position. When ganging block 60 is in the second switch position, this corresponds to the second position so shown in FIG. 4 and slide switch controls 44 and 46 establish a signal flow through signal port 74, switch 42, signal ports 64 and 66 and the cable attached thereto, switch 40, and signal output port 76.

There can be many types of ganging provided by various mechanical devices. A simple push button or pull switch could be utilized. One of the many important features of this invention is that the user cannot immediately ascertain the signal path through the cable comparator. By continually switching the signal path between the audio interconnect cables attached to the front of the signal comparator as compared to the signal path through cables attached to rear of the comparator, the user can quickly detect the signal distortion by using the switch and audibly comparing acoustic performance. In this manner, the user can make an objective evaluation of the quality, value and suitability of the cables.

The preferred application is between a CD player as an audio music source 10 or a digital to analog converter and a pre-amp. Another effective use of the comparator is between an audio source and a headphone amplifier. This headphone amplifier would be attached to signal output OUT1 and OUT2 (FIG. 1) and ultimately attached to headset 12. Passive pre-amps are not recommended unless they are docked or electrically connected directly between the comparator and the amplifier. This avoids introduction of cable drive limitations which are unwanted test variables. Applications with the fewest links in the chain or electrical signal channel such as between a musical source and an amplifier which has a built-in volume control, provide a clean link between reference quality-components. Exceptionally neutral speaker cables tend to improve the audio test because these components minimize masking effects.

In order to reduce the electrical signal losses and electrical signal distortions by other interconnected cables, the present invention utilizes a docking coupler 310. This docking coupler is approximately 2" in length. The opposed male RCA jacks are offset such that male RCA jack 314 has a jack axis 316 and opposing RCA male jack 320 is offset approximately ½–¾" apart from axis 316. In this manner, docking coupler 310 can be rotated as shown by arrow 321 such that a pair of docking jacks, connected to signal input ports 74, 75 (FIGS. 2, 3), can be directly plugged into the backside of a CD player or other source of music. In a similar manner, two output docking couplers could be utilized to plug the signal comparator into the backside of the headphone amplifier. These docking couplers allow audio components to be docked and electrically connected together with an absolute minimum of signal degradation. Signal degradation through these docking couplers is thought to be less then a signal single conventional RCA plug.

The bare copper contact surfaces of the male element 314 and male element 315 of docking coupler 310 are treated at the factory with PROGOLD, an advanced contact conditioning treatment which retards oxidation and provides a good connection to most common jack materials. PROGOLD is sold by Caig Labs of San Diego, Calif.

With two docking couplers 310, a source of signals can be directly connected to the cable comparator if the output jacks for that musical source are spaced up to two inches apart.

Bypass switch 130 (FIG. 3 and FIG. 2), is connected to the switch terminals by 1" of solid 6N copper hookup wire. An example of a good bypass switch is a SwitchCraft slide switch, Model No. 5208L.

In operation, the user rotates selector knob 212 in FIG. 10 or selector knob 14 in FIG. 1. Each change requires the user to turn the knob a half turn to the next "click stop" of the mechanism. An indicator disc 213 (FIG. 10) shows white and black hemispherical indications. These white and black indications are shown on switch 14. The black shaded area and the white or unshaded area shows this B/W indicator. The user rotates knob 212 or knob 14 such that he or she cannot ascertain whether the signal path includes cable pair 16 or cable pair 20 (FIG. 1). The user then carefully listens to the audible sounds developed by the music source for approximately 30 to 60 seconds each while he or she rotates switch 14 or switch 12. In this manner, the user can easily ascertain and compare the sonic characteristics of the two pair of audio interconnect cables. Alternatively, the user may uncouple cable set 20 and move bypass switch 32 (FIG. 1) or bypass switch 130 (FIGS. 2, 3), such that a direct connection is provided between source 10, bypass switch 36, output ports OUT1 and OUT2 and headset 12. If two interconnect cables are used, the user can disconnect one of the cables and then "discover" the operating switch setting by rotating knob 14 or knob 212 to the appropriate position this switch position corresponds to the ON or CLOSED signal channel and the associated cable set.

It is suggested that the user initially begin listening at a low volume level to determine if a setup is working correctly. Since the comparator switches the grounds as well as the signal leads, there may be a click or a pop when the selector is switched. In most systems, the cable comparator switches quietly. Switching noise may be reduced by correcting the AC polarity or ground loop in the system. Further, it is recommended that the user mute the pre-amp or change to a different input while turning the switch knob to avoid any possible damage to associated audio components due to the switching noise. Most listeners can determine the sonic characteristics of the interconnect cables utilizing a 30–60 second listening interval.

The claims appended hereto are meant to cover modifications and changes within the spirit and scope of the present invention.

What is claimed is:

1. Method for comparing the sonic characteristics of two pair of audio interconnect cables comprising the steps of:

providing two channels of analog electrical signals respectively representing left and right audio signals from an audio source generating said electrical signals;

providing an amplifier and a pair of speakers for respectively converting said two channels of analog electrical signals into audible sounds;

providing two pair of audio interconnect cables, each pair of interconnect cables capable of carrying said two channels of analog electrical signals thereon, one pair of interconnect cables being designated as reference cables and another pair of interconnect cables being designated as test cables;

in a first instance, switching, electrically connecting and transferring said analog electrical signals from said audio source to said amplifier and pair of speakers via said reference cables;

in a second instance, switching, electrically connecting and transferring said analog electrical signals from said audio source to said amplifier and pair of speakers via said test cables;

the steps of switching being controlled by a user such that the user cannot ascertain which pair of cables is electrically connected to said source and said speakers and is transferring said analog electrical signals thereon; and the step of electrically connecting and transferring said analog electrical signals from said audio source to said speakers via said reference cables during said first instance is conducted with substantially identical electrical losses and electrical signal distortion when compared to the step of electrically connecting and transferring said analog electrical signals from said audio source to said speakers via said test cables during said second instance.

2. An interconnect cable comparator for comparing the sonic characteristics of two pair of audio interconnect cables, one pair of interconnect cables being designated as reference cables and another pair of interconnect cables being designated as test cables, said cable comparator being electrically connected between an audio source generating two channels of analog electrical signals respectively representing left and right audio signals, an amplifier and a pair of speakers for respectively converting said two channels of analog electrical signals into audible sounds, said comparator comprising:

a switch assembly having a pair of signal input terminals, a first and a second pair of switchable cable output terminals switchably coupled to said pair of signal input terminals, a pair of signal output terminals and a first and a second pair of switchable cable input terminals switchably coupled to said pair of signal output terminals;

a pair of signal input ports coupled to said pair of signal input terminals of said switch assembly and adapted to be electrically connected to said audio source;

a pair of signal output ports coupled to said pair of signal output terminals of said switch assembly and adapted to be electrically connected to said amplifier and pair of speakers;

four pair of interconnect cable ports, a respective pair of cable ports coupled via independent electrical channels to said first and second pair of switchable cable output terminals and said first and second pair of switchable cable input terminals;

wherein electrical losses and electrical signal distortion between said independent electrical channels established through said signal input ports, said switch assembly, said four pair of interconnect cable ports and said signal output ports are substantially identical; and wherein said reference cables are adapted to be removably attached between a first and a second pair of cable ports of said four pair of interconnect cable ports which are electrically coupled to said first pair of switchable cable output terminals and said first pair of switchable cable input terminals; and wherein said test cables are adapted to be removably attached between a third and a fourth pair of cable ports of said four pair of interconnect cable ports which are electrically coupled to said second pair of switchable cable output terminals and said second pair of switchable cable input terminals;

whereby sonic characteristics of said test cables and said reference cables are audibly detectable based upon a control position of said switch assembly and said sonic conditions are not substantially affected by said switch assembly, said signal input ports, said four pair of interconnect cable ports and said signal output ports due to said substantially identical electrical losses and electrical signal distortion.

3. A comparator as claimed in claim 2 wherein said switch assembly is a pair of four pole, double throw switches having their user actuated switch controls ganged together.

4. A comparator as claimed in claim 2 wherein the switch terminals are mechanically and directly connected to said signal input and output ports and to said four pair of cable ports.

5. A comparator as claimed in claim 2 including a bypass switch electrically connected between said first pair of switchable cable output terminals and said first pair of switchable cable input terminals, said bypass switch being used to replace the electrical channels established by said reference cables.

6. A comparator as claimed in claim 2 wherein said switch assembly is disposed in a box thereby blocking a user's view of said switch assembly's position.

7. A comparator as claimed in claim 3 wherein said user actuated switch controls are slide controls and said slide controls are actuated by a rotating, offset cam, said offset, rotating cam being rotated by said user to select said test cables or said reference cables to compare said sonic characteristics of the same.

8. A comparator as claimed in claim 7 including a bypass switch electrically connected between said first pair of switchable cable output terminals and said first pair of switchable cable input terminals, said bypass switch being used to replace the electrical channels established by said reference cables.

9. An interconnect cable comparator for comparing the sonic characteristics of a pair of audio interconnect cables and fixed electrical reference conduits, said cable comparator being electrically connected between an audio source generating two channels of analog electrical signals respectively representing left and right audio signals, an amplifier and a pair of speakers for respectively converting said two channels of analog electrical signals into audible sounds, said comparator comprising:

a switch assembly having a pair of signal input terminals, a first and a second pair of switchable cable output terminals switchably coupled to said pair of signal input terminals, a pair of signal output terminals and a first and a second pair of switchable cable input terminals switchably coupled to said pair of signal output terminals;

a pair of signal input ports coupled to said pair of signal input terminals of said switch assembly and adapted to be electrically connected to said audio source;

a pair of signal output ports coupled to said pair of signal output terminals of said switch assembly and adapted to be electrically connected to said amplifier and pair of speakers;

two pair of interconnect cable ports, a first pair of cable ports coupled to said first pair of switchable cable output terminals and a second pair of cable ports coupled to said first pair of switchable cable input terminals;

a plurality of low electrical loss channels, a respective low loss channel electrically connected between said second pair of switchable cable output terminals of said switch assembly and said second pair of switchable cable input terminals of said switch assembly, said low loss channels formed by a plurality of low loss wires;

wherein said interconnect cables are adapted to be removably attached between said first and said second pair of cable ports which are electrically coupled to said first pair of switchable cable output terminals and said first pair of switchable cable input terminals; and whereby sonic characteristics of said interconnect cables are audibly detectable based upon a control position of said switch assembly which switchably transfers analog electrical signals through said interconnect cables or said low loss channels based upon a position of said switch.

10. A comparator as claimed in claim 9 wherein said switch assembly is a pair of four pole, double throw switches having their user actuated switch controls ganged together.

11. A comparator as claimed in claim 9 wherein the switch terminals are mechanically and directly connected to said signal input and output ports and to said two pair of cable ports.

12. A comparator as claimed in claim 9 including a bypass switch electrically interposed in said low loss channels.

13. A comparator as claimed in claim 10 wherein said user actuated switch controls are slide controls and said slide controls are actuated by a rotating, offset cam, said offset, rotating cam being rotated by said user to select said interconnect cables or said low loss channels to compare said sonic characteristics of the same.

* * * * *